United States Patent [19]

Shuey et al.

[11] 4,127,806
[45] Nov. 28, 1978

[54] SHIELDED ELECTROMETER WHOSE OUTPUT IS USED TO CONTROL WIDTH OF PULSES FED BACK TO THE SHIELD AND ASSOCIATED BATTERY TEST CIRCUITRY

[75] Inventors: David R. Shuey, Webster; Robert J. Slomcenski, Rochester, both of N.Y.

[73] Assignee: Xerox Corporation, Stamford, Conn.

[21] Appl. No.: 783,910

[22] Filed: Apr. 1, 1977

[51] Int. Cl.² .................... G01R 5/28; G01R 29/12
[52] U.S. Cl. .................................. 324/32; 324/72; 324/109
[58] Field of Search ............... 324/32, 72, 72.5, 109, 324/149, 156

[56] References Cited

U.S. PATENT DOCUMENTS

| | | | |
|---|---|---|---|
| 3,935,532 | 1/1976 | Shuey et al. | 324/72 |
| 4,063,154 | 12/1977 | Andrus et al. | 324/32 |
| 4,063,155 | 12/1977 | Buchheit | 324/32 |

*Primary Examiner*—Robert J. Corcoran

[57] ABSTRACT

An electrometer having reduced spacing sensitivity, with the electrometer including a probe with a charge receiving sensor element and a surrounding shield. A voltage equivalent to that sensed by the probe element is fed back to the shield to render the electrometer substantially spacing insensitive. A duty cycle control regulates the width of electrical pulses to a power transformer whose output is fed back to the probe shield to maintain the spacing insensitivity. Means are also provided to automatically test and calibrate the electrometer prior to use.

7 Claims, 7 Drawing Figures

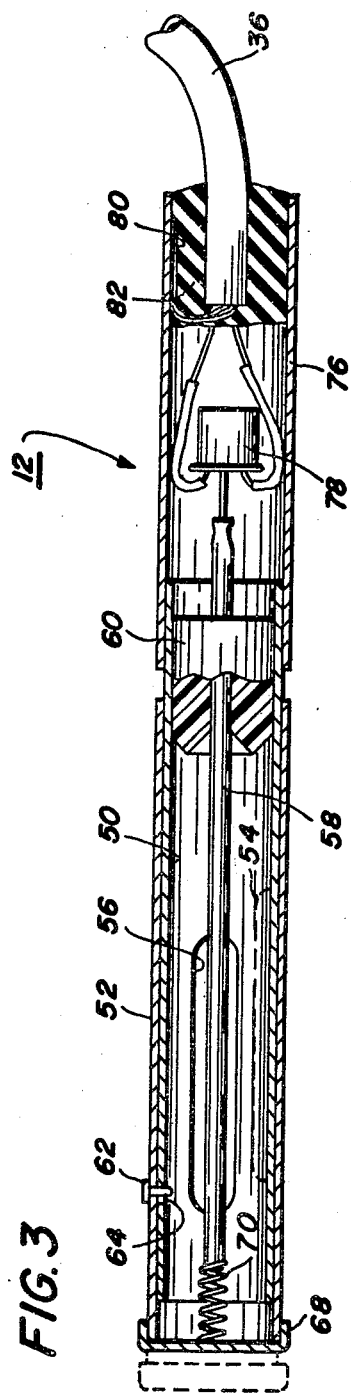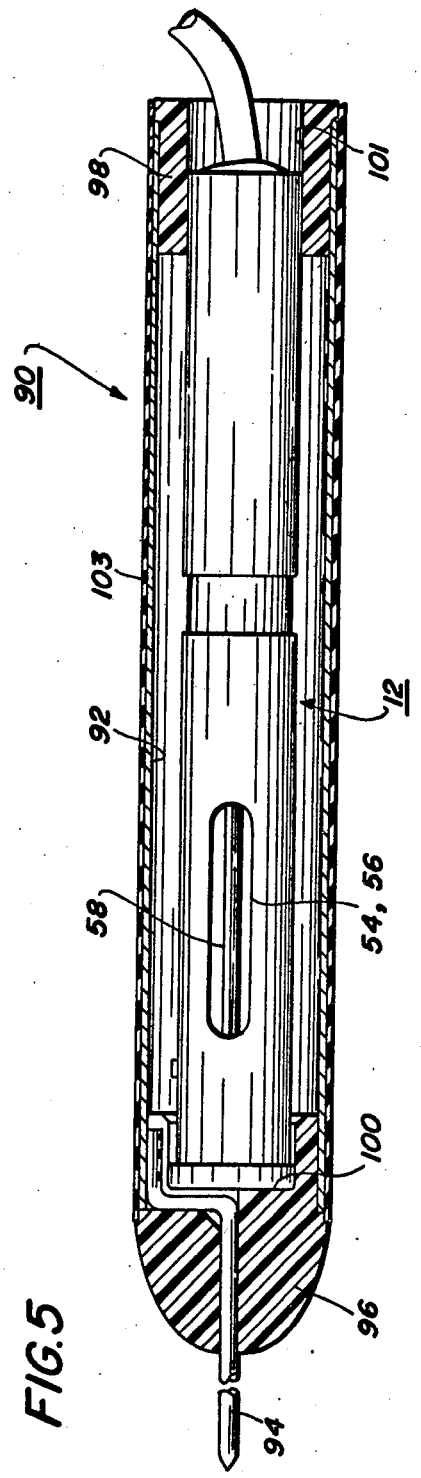

SHIELDED ELECTROMETER WHOSE OUTPUT IS USED TO CONTROL WIDTH OF PULSES FED BACK TO THE SHIELD AND ASSOCIATED BATTERY TEST CIRCUITRY

BACKGROUND OF THE INVENTION

This invention relates to electrostatic voltmeters, more commonly referred to as electrometers.

An electrometer is an instrument for measuring the electrostatic charge potential levels on a surface. Generally, a probe is placed near the test surface and the charge thereon is capacitivly coupled to the probe. Associated electrical circuitry electrically connected to the probe provides a voltage output representative of the quantitative charge sensed by the probe. Typically, this voltage output is read and displayed by a commonly used voltmeter.

While the electrometer may be used in a variety of applications, it has found increasing use in the xerographic process wherein copies are produced from a latent electrostatic image formed on a charged photoreceptor. To insure good copy quality, the level of charge on the photoreceptor must be maintained within predetermined limits. Consequently, service personnel must periodically check to see if the proper charge level is being maintained on the photoreceptor and, if not, they must adjust the amount of charge being applied to the photoreceptor, change exposure levels, etc. Normally, the service personnel also makes other adjustments to the machine. With the advent of present day highly complex machines, there are many other technical measurements and adjustments to be monitored. Accordingly, the number of tools necessary for the service personnel to accomplish their tasks are proportionally increasing. Therefore, it is a feature of this present invention to provide an electrometer housing which is attachable to a voltmeter to thereby provide a compact and readily accessible tool for measuring charge levels on a surface.

Electrometers are extremely delicate instruments. Therefore, care must be taken to prevent spurious high voltage transients from entering the finely adjusted circuitry or else permanent damage may result to the components. Similarly, the charge receiving element and other components in the probe must be protected from adverse environmental conditions which can effect their ability to accurately measure the charge from the test surface. Unfortunately, users have not always given their electrometers the attention they deserve, with the result of repairs or replacement being often needed. Therefore, it is another feature of this invention to provide a probe which provides excellent protection to increase the accuracy and longevity of the electrometer.

In servicing xerographic machines, other voltage measurements must be taken on various other machine components which, unlike the photoreceptor, may be physically contacted with the wires of a voltmeter. The electrometer, instead of the voltmeter, is used in measuring the photoreceptor potential because the wires or clips of the voltmeter could scratch its surface. However, other components such as power supplies can be contacted with the voltmeter and a direct reading may be taken without the use of the electrometer. Unfortunately, inaccurate readings have been experienced due to the voltmeter "loading down" the supply. To alleviate this condition, this invention provides an adapter for the electrometer probe which permits accurate contact measurements to be made. Since by using the housing of this invention the service personnel already has his electrometer attached to the voltmeter, the more accurate reading can be made without unduly increasing the number of tools required.

Early d.c.-type electrometers suffered from spacing sensitivity; i.e., their output measurements would be critically dependent upon the distance between the probe and the test surface. It has been suggested to obviate this problem by feeding back to the probe shield a voltage equivalent to that sensed by the probe charge receiving element. It is a further feature of the present invention to improve upon this general concept and provide an electrometer with minimal power requirements, components, and current capacity. The present invention permits battery operation which further increases the utility of the device in a field type environment, e.g., increased portability, with the ability to measure "floating" voltages not referenced to earth ground. Moreover, the cost of the device is maintained at a relatively low level and the useful life of the electrometer is increased.

The electrometer of this invention also includes the capability of self-testing the operation of its components, as well as automatically zeroing or calibrating itself prior to use to insure accurate measurements.

BRIEF DESCRIPTION OF THE DRAWINGS

These and other features of this invention will become more apparent upon reading the ensuing specification and by referring to the drawings in which:

FIG. 3 is cross-sectional view of the electrometer probe;

FIG. 5 is a cross-sectional view of an adapter for the probe shown in FIGS. 3 and 4 to enable contact measurement of potential levels.

DESCRIPTION OF THE PREFERRED EMBODIMENTS

Figure 1:
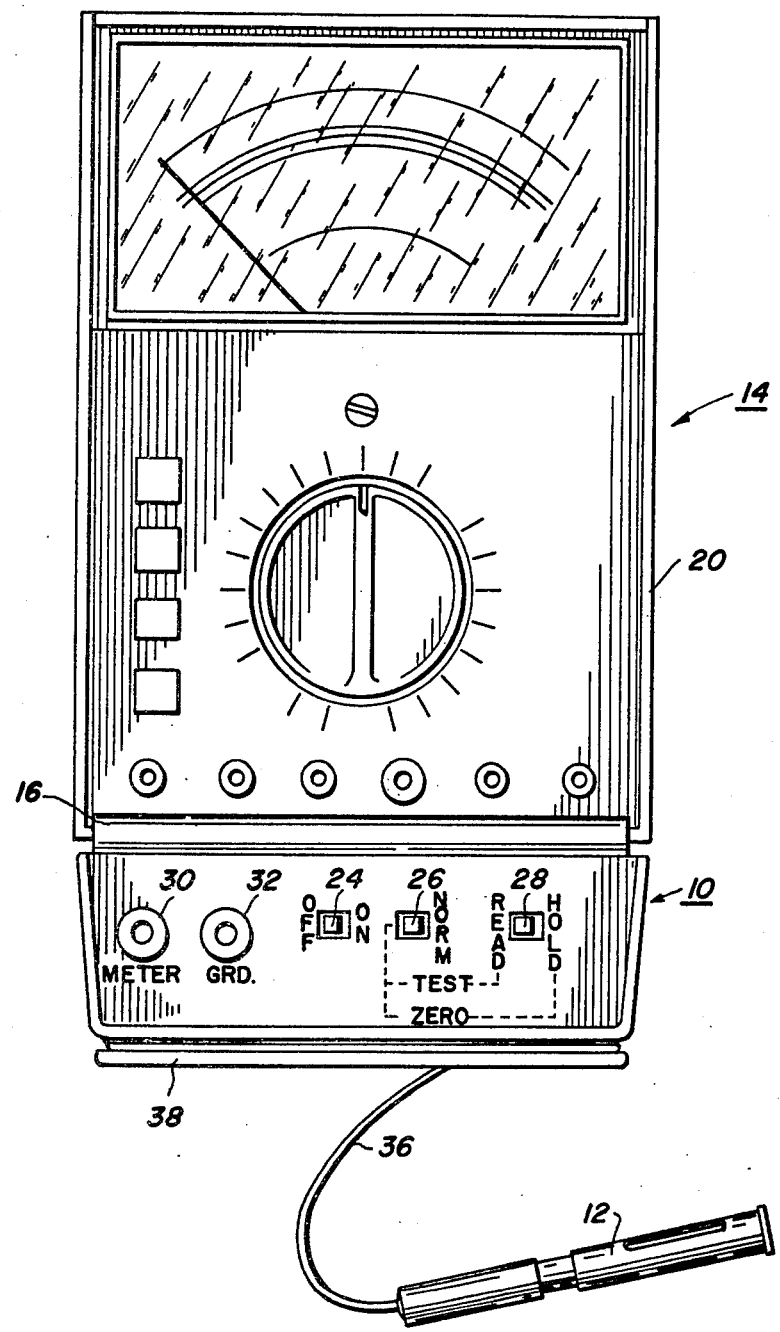
FIG. 1 is a front plan view of the electrometer housing, with the housing being attached to a voltmeter.
Figure 2:
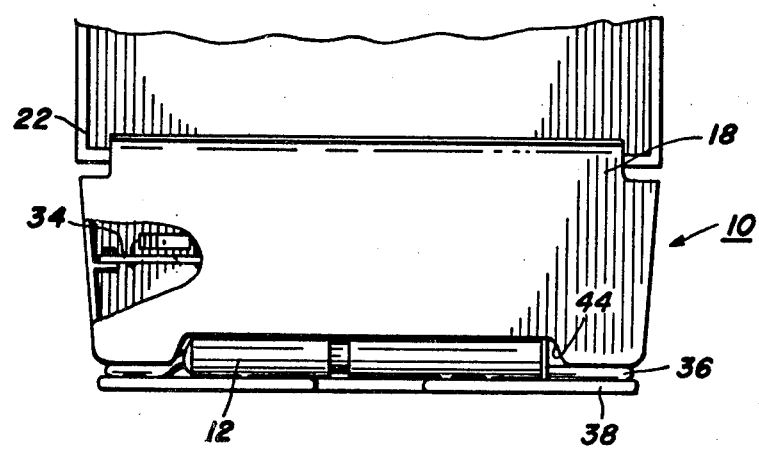
FIG. 2 is a plan view, with portions broken away, of the reverse side of the electrometer housing shown in FIG. 1.

Referring now to FIGS. 1 and 2, there is shown a housing 10 for holding an electrometer probe 12 and associated the electrical circuitry in an integral unit. The electrometer housing 10 is adapted to be utilized in conjunction with a commonly used voltmeter 14, for example, such as that manufactured by Weston Company. It is a feature of this invention that housing 10 is removeably attachable to the voltmeter 14 to provide a compact and readily accessible means for measuring electrostatic charge levels on a surface. In this embodiment, the housing 10 is a container, preferably being a nonconductive material such as plastic, having a cross-sectional dimension substantially conforming to that of the voltmeter. Accordingly, the housing 10 provides a generally continuous structure when attached to the voltmeter 14 as can be seen in FIG. 1. In the embodiment of FIG. 2, housing 10 includes spring clips 16 and 18 on both the upper front and back portions of the housing 10, respectively. Clips 16 and 18 are adapted to engage lips 20 and 22, respectively, projecting around the periphery of the voltmeter 14.

Figure 2A:
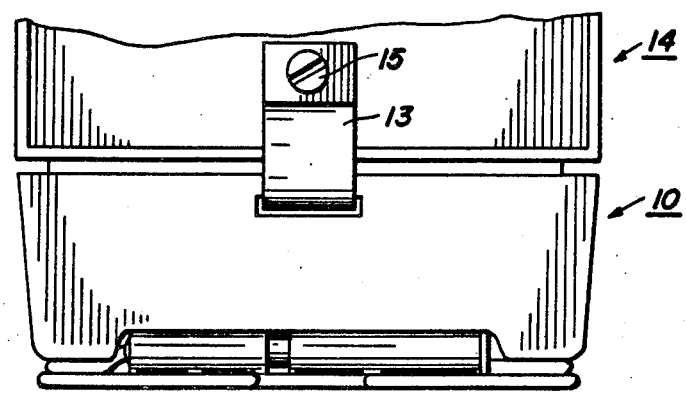
FIG. 2a depicts an alternate embodiment of the housing illustrating another method of attachment to the voltmeter.

Spring clips 16, 18 can be made as an integral part of the housing 10 as shown thereby keeping manufacturing costs to a minimum. However, other attachment means are envisoned such as that shown in FIG. 2a. In this alternate embodiment, a strap 13 is substituted for the back spring clip 18. The strap 13 engages internal portions of the housing 10 as shown and is attached to the voltmeter 14 by a screw 15.

Housing 10 may also include switches such as on/off switch 24 and function switches 26, 28. Similarly, receptacles 30, 32 are provided for receiving voltmeter wire pins or clips (not shown) to enable the voltmeter 14 to read and display the charge sensed by probe 12 as a measure of voltage or potential levels. Probe 12 is connected to associated electrical circuitry detailed herein, mounted on a printed circuit board 34 in housing 10 by a multiconductor shielded cable 36. Housing 10 includes a spindle 38 projecting from lower portions thereof around which the cable 36 may be wound for convenient storage.

As will be explained in more detail below, probe 12 is adapted to maintain two configurations, each having a different longitudinal dimension. With the probe 12 pulled apart along its longitudinal axis, the probe 12 is capable of reading charge by exposing an internal charge receiving sensor rod through windows in the probe housing or shield. When the probe 12 is pushed together, the windows are misaligned to protect the rod from spurious electrical charges and environmental conditions. As can be seen, the housing 10 includes a compartment 44 for receiving the probe 12 for storage. In order to ensure that the probe 12 will be protected when not in use, the compartment 44 is only wide enough to receive probe 12 when the probe is in its storage configuration, i.e., having been pushed together to misalign the windows thereby protecting the internal components.

Thus, it can be seen that the electrometer housing 10 provides a convenient tool for service personnel since all of the apparatus required to measure charge levels are contained in an integral unit. The voltmeter can be used by itself when desired or in conjunction with the electrometer merely by inserting its wires or cables into receptacles 30 and 32. Accordingly, through the use of this unique electrometer housing the task of the service personnel is made considerably easier.

Figure 4:
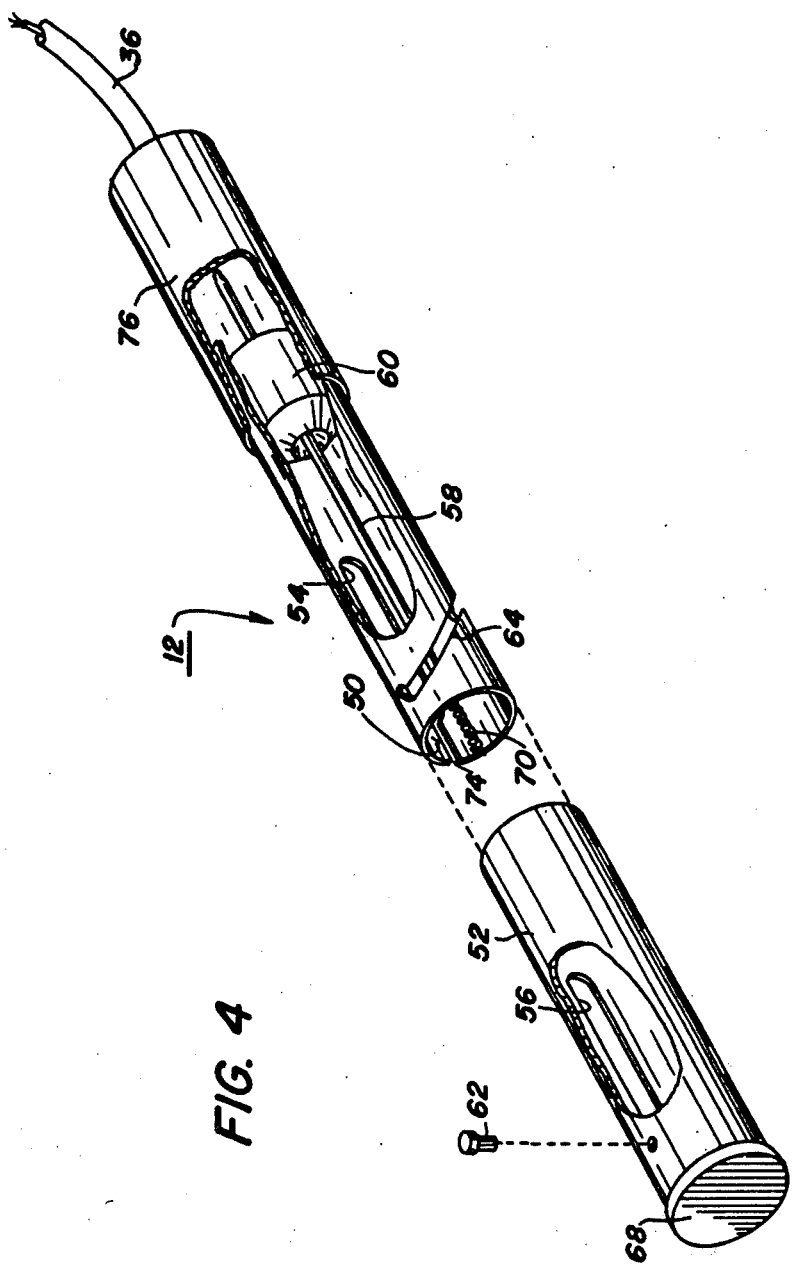
FIG. 4 is an exploded view of the probe shown in FIG. 3.

FIGS. 3 and 4 show the probe 12 in more detail. Probe 12 includes an inner tube 50 and outer tube 52 which are slidably mounted together so as to permit both rotational and longitudinal movement therebetween. Tubes 50 and 52 are constructed of a conductive material, preferably metal such as brass. Inner tube 50 includes a window 54, whereas outer tube 52 also includes a window 56 in its periphery. A conductive sensor rod 58 is mounted coaxially inside the inner tube 50. An insulating plug 60 supports rod 58 in the tube 50 and electrically insulates it therefrom. Rod 58 is also constructed of a conductive material, which in this embodiment is brass. When exposed to a charged surface, the rod 58 becomes charged to an equivalent level through capacitive coupling as is known in the art. It is a feature of this invention that windows 54 and 56 are automatically aligned when inner and outer tubes 50, 52 are longitudinally pulled apart thereby enabling rod 58 to be exposed to the charge on the surface being sensed. This is accomplished by a pin/slot arrangement in the inner and outer tubes. Pin 62 in the periphery of outer tube 52 rides in a diagonal slot 64 in the periphery of inner tube 50. When the tubes 50, 52 are pushed together, the windows 54, 56 are misaligned as shown most clearly in FIG. 3. Consequently, the rod 58 is not exposed to any charge and is protected from adverse environmental conditions, etc. When the tubes 50, 52 are longitudinally pulled apart, pin 62 is guided by slot 64 to cause concurrent rotational movement of the tubes to bring the windows 54, 56 into alignment. Remembering that the probe 12 is to be inserted into compartment 44 in the housing 10 during storage, it can now be realized that this probe construction provides a fail safe method of insuring that the rod 58 will be protected when not in use. This is because the probe must be in its compact or "pushed in" configuration for storage in the housing 10. Consequently, when the probe is properly stored in the housing compartment 44 the rod will be automatically protected.

To further aid in the protection of the rod 58 and other important internal components in the probe 12, there is also included an end cap 68 conductively mounted on the end of tube 52. A conductive resilient member such as spring 70 is also conductively mounted on one end of rod 58. Spring 70 projects a predetermined distance from the end of rod 58 so that spring 70 contacts cap 68 only when the probe 12 is in its pushed in configuration. Consequently, the rod 58 is electrically shorted to the outer tubes 50, 52 which form a shield for the rod 58. In such manner, any residual charge on the rod 58 is discharged when the probe is in its storage configuration thereby protecting the sensitive electrical circuitry attached thereto as will be explained herein.

Inner tube 50 also includes an slot 74 extending longitudinally from one end of the tube. In such manner, indentation 74 provides a bifurcation in the one end of inner tube 50 which provides an outwardly extending radial force on the inner walls of the outer tube 52. This provides a friction fit between the inner 50 and outer tubes 52, as well as insuring good electrical connection therebetween. A cylindrical member 76 is soldered to one end of inner tube 50 to complete the shield for the rod 58. Mounted within member 76 is a high impedance active electrical component such as field effect transistor (FET) 78. The gate of transistor 78 is coupled to rod 58, while the source and drain leads to transistor 78 are connected to wires in cable 36. The shielding 80 of cable 36 is soldered to the member 76 to provide immunity to electrical noise and transients. The end portions of member 76 are potted with an epoxy adhesive 82 to seal the device.

Referring now to FIG. 5, there is shown an adapter 90 for use with an electrometer probe, for example, such as that described in connection with probe 12. It is recognized, that an electrometer probe is for noncontact measurement of electrostatic charge levels on a surface. It is unlike a voltmeter which measures potential levels by actually contacting the object. In many xerographic machines, voltage or potential levels on certain components, e.g., electrode and developer bias power supplies, must be adjusted by service personnel. Unfortunately, accurate and consistent readings cannot always be taken by commercially available voltmeters, such as voltmeter 14 previously described. It has been discovered that this is due to the meter effectively "loading down" the power supplies under test. This phenomena is due to the fact that the meter draws off current from the supply whose potential is desired to be measured. Consequently, the meter tends to read out less than the actual voltage level on the test object. It has been discovered that much more accurate measurements can be taken with the adapter 90 shown in FIG. 5 which is used in cooperation with an electrometer.

Adapter 90 includes a conductive cylindrical shell 92 having a conductive member such as needle 94 projecting from one end of the shell 92. Conveniently, needle 94 is soldered to shell 92 to provide good electrical connection therebetween. End plug 96 closes off one end of the adapter. Plug 96 is an electrical insulator and preferably is made of plastic. An insulator spacer 98 cooperates with end plug 96 to support an electrometer probe, such as probe 12, within the shell 92 as can be seen in FIG. 5. Plug 96 includes an indentation or socket 100 for receiving end portions of the probe 12. Spacer 98 includes a circular bore 101 therein cooperating with socket 100 in such manner that probe 12 is substantially equally spaced from the conductive shell 92. An insulating wrapper 103 completely insulates the adapter 90 except for the needle 94.

To utilize the adapter 90, the electrometer probe is merely inserted into the adapter 90 and is supported therein by plug 96 and spacer 98. If probe 12 is utilized, the inner 50 and outer 52 tubes are pulled apart prior to insertion to align the windows 54, 56 thereby exposing rod 58 to the inner portions of conductive shell 92. It should also be noted that rod 58 is substantially equadistantly spaced from the inner wall of shell 92. This aids in accurate measurements regardless of the direction in which the rod 58 is facing. Although the electrometer of the present invention is distance insensitive, other probes can be utilized with adapter 90, with such probes not having the features of the present invention thereby necessitating equal spacing between the charge receiving element (e.g., rod 58) of the electrometer and the charged surface being sensed.

The adapter 90 and the electrometer probe 12 effectively form a contact probe for measuring electrical potentials. A major feature of this invention is that adapter 90 provides a manually movable unit specifically adapted for contacting the surface whose voltage is to be sensed. The adapter 90 is about the size of a cigar tube and consequently can be readily maneuvered with one hand. When needle 94 is touching the object, the potential level on the object is conductively transferred from needle 94 to the conductive shell 92. Consequently, shell 92 receives an electrical charge which is indicative of the voltage level being sensed. The electrometer probe 12 residing within the adapter 90 senses the charge on the shell 92 and provides a reading via its normal operation. Thus, the adapter 90 permits the electrometer to measure voltage levels by actually contacting the surface. However, the adapter 90 will not load down the apparatus being measured since the apparatus sees an extremely high impedance, in effect an open circuit, since there is an actual air gap between the rod 58 in the electrometer probe 12 and the shell 92. Consequently, the adapter 90 of this invention provides an extremely effective, as well as convenient tool for accurately measuring potential levels in a variety of applications.

Figure 6:
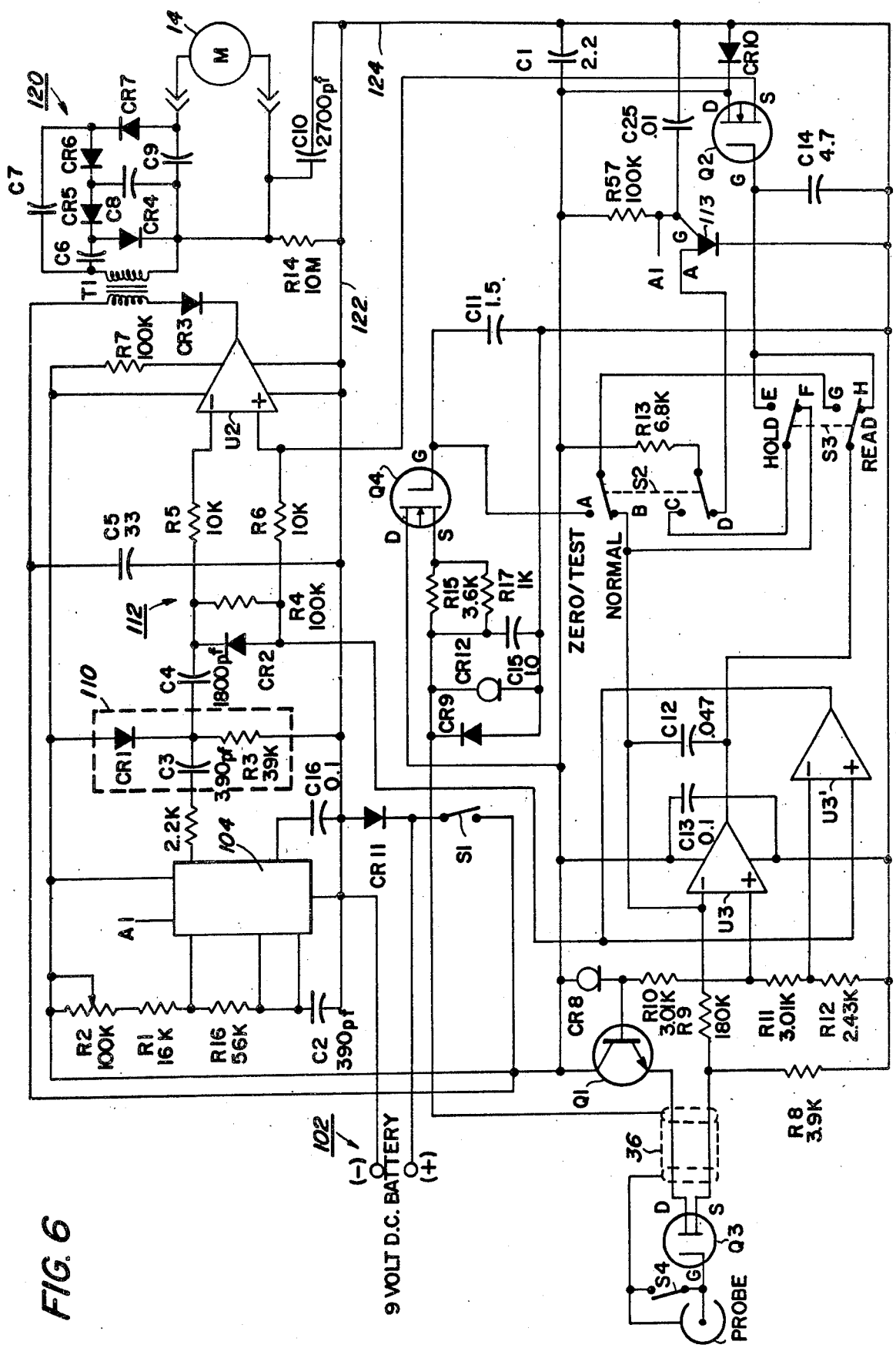
FIG. 6 is an electrical schematic diagram of the circuitry for the electrometer.

Referring now to FIG. 6, there is shown an electrical schematic diagram of the electrometer circuit of the present invention. This circuitry converts the charge sensed by probe 12 into a voltage level readable by voltmeter 14. The probe 12 is schematically represented as having a shield and charge receiving sensor rod. In this embodiment, switch S4 represents the spring 70 — cap 68 contact, with the switch being closed when the probe 12 is in its storage configuration. The MOS field effect transistor Q3 represents the transistor 78 within the probe 12. Cable 36 is shown schematically with its internal wires coupled to the drain and source of transistor Q3 and its shield connected to the shield of the probe 12. The probe shield can be envisioned as a combination of member 76 and tubes 50, 52. With reference to FIG. 1, switch S1 represents the switch 24, with switch S2 representing switch 26 and switch S3 representing switch 28.

When on/off switch S1 is closed, a low voltage DC supply 102, such as a typical nine volt radio battery, drives an astable multivibrator 104. In this embodiment, multivibrator 104 is a commercially available timer/oscillator such as component No. 555 manufactured by Motorola, Inc. The frequency of oscillation, approximately 21 kilohertz in this embodiment, is determined by the values of capacitor C2 and resistors R1, R2 as known in the art. Resistor R2 is preferably a potentiometer which permits easy variation of the oscillating frequency. Input A1 to multivibrator 104 enables the multivibrator when an appropriate signal is applied to it, as will be discussed later herein.

The AC square wave from multivibrator 104 is transformed to a triangular shaped pulse of about a 10 microsecond width by differentiator 110.

The output pulse from the differentiator 110 is DC decoupled through capacitor C4 to rid the pulse train of extraneous DC levels. The pulse train is then restored to a DC level of about 1 volt by diode CR2 and resistor R4. The clamping voltage is derived from the constant voltage from R12 provided by the voltage follower output of operational amplifier U3' which will be described later. Consequently, a triangular pulse train biased at a DC level of about +1 volt is coupled to the inverting input of operational amplifier U2. U2 may be that such as a model No. CA3094 by RCA Company. The output of amplifier U2 is coupled to transformer T1 through diode CR3 which protects amplifier U2 from deleterious back E.M.F. levels.

The output of amplifier U2 acts as a duty cycle control for transformer T1 which has a turns ratio of about 1:50. Operational amplifier U2 acts as a comparator wherein it modulates the output pulse width according to the input signals on its inverting and noninverting inputs. The noninverting input of operational amplifier U2 is coupled to a source follower circuit comprised of transistor Q2 and resistor R6. As the gate voltage on transistor Q2 increases, the DC level at the noninverting input also increases. Since the amplifier U2 operates as a comparator, the pulse width at its output depends upon the difference of the two input signals. Accordingly, as the DC level on the noninverting input increases, the difference similarly decreases as the noninverting signal approaches the peak of the pulses to the inverting input. In such manner, the transformer T1 is energized for a decreasing amount of time thereby decreasing the amount of voltage at its secondary winding. As will be explained, the voltage on the gate of Q2 is determined by the difference, if any, of the charge level on the sensor rod of probe 12 and a reference voltage.

A voltage multiplier circuit 120 multiplies the voltage at the secondary of transformer T1 approximately four times. This voltage is fed back to the shield of probe 12 as will be described later herein. Consequently, the probe shield will be biased at the same potential level as the probe rod when it is sensing an external field. Since the output of the voltage multiplier 120 is providing the same potential to the shield as that sensed by the probe rod, the charge on the test object can be read by connecting a voltmeter 14 to the output of the voltage multiplier 120 as shown in FIG. 6.

It is crucial that the electrometer be accurately zeroed or calibrated before use to provide a level of reference. This compensates for individual component operating characteristics such as threshold voltages, resistance tolerances, diode voltage drops, etc. It is a feature of this invention that the electrometer is automatically calibrated without making any manual adjustments. In calibrating the electrometer according to the present invention, the probe shield and rod are initially shorted together via switch S4. This removes any electrical charge from the probe 12. As already described, this has been accomplished automatically when the probe 12 is in its pushed-in or storage configuration. The circuitry of the present invention provides an internally generated reference voltage to the non-inverting input of operational amplifier U3. This voltage reference is independent of the actual voltage condition of the battery 102. This is provided through the use of a constant current diode CR8 coupled to the positive side of battery 102. Serially connected to diode CR8 are resistors R10, R11, and R12. The constant voltage drop across resistors R10 and R11 is coupled to the non-inverting input of operational amplifier U3. In this embodiment, the reference voltage is approximately 3 volts. Operational amplifier U3 is a high gain multipurpose operational amplifier such as Model No. SN72LO22P distributed by Texas Instruments, Inc. For ease in describing the circuitry of the present invention, operational amplifier U3' is shown as a separate device. However, it should be realized that, in fact, it is the same device as amplifier U3 with different input and output pins being utilized. The voltage across R10-R12 biases transistor Q1 at a constant voltage level. Consequently, transistor Q1, as an emitter follower, provides a constant voltage on the drain of transistor Q3 and also acts to decouple transistor Q3 from noise transients. Amplifier U3 thus has a constant voltage level at its non-inverting input at all times.

To calibrate the electrometer, switch S3 is placed in the HOLD position with its wipers contacting poles E and G. Switch S2 is placed in its ZERO/TEST position, with its wipers being connected to poles A and C. With switches S2 and S3 in this mode, there is a feedback loop created from the output of amplifier U3, through transistor Q4 to the probe shield and gate of transistor Q3, then back to the inverting input of amplifier U3. The probe 12 is then pulled apart to a distance such that switch S4 (spring 70 — cap 68 connection) is opened, but the windows 54, 56 remain misaligned. Since the probe shield and inner rod are essentially at the same potential level, the gate of transistor Q3 similarly is at that potential. Transistor Q3 is connected in a source follower circuit with resistor R8. Consequently, the voltage at the source of transistor Q3 follows that on the gate of transistor Q3. This potential is coupled to the inverting input of amplifier U3 via resistor R9, while the noninverting input of amplifier U3 remains at the reference level. Amplifier U3 compares the source voltage from transistor Q3 with that of the reference level and integrates any error which is present. The integration rate is determined by resistor R9 and capacitor C12. By integrating the error, as compared to merely amplifying it, the two input voltages can be brought within approximately +1 microvolts. The error signal, if any, is coupled to the gate of transistor Q4. The voltage at the source of transistor Q4 also follows that of the gate. The source of transistor Q4 is coupled via cable 36 to the gate of Q3 through the capacitance between the shield and rod of probe 12. Consequently, the source of transistor Q3 follows this voltage and provides a new voltage level to the inverting input of amplifier U3. This process continues until the inputs of amplifier U3 are equal. This removes the error voltage between the inputs of amplifier U3, with its output holding steady at this level. Consequently, both the probe shield and rod are automatically zeroed or calibrated by bringing them to a fixed, and predetermined known voltage level.

It is important to note that during this process the voltage multiplier 120 has been deenergized. This is accomplished by decreasing the duty cycle of transformer T1 to zero. When switches S2 and S3 are in their upward position as previously described, the positive side of battery 102 is connected to the gate of transistor Q2 via resistor R13. The source of transistor Q2 follows that of its gate and causes the duty cycle to decrease accordingly as previously described.

When switch S2 is placed in its NORMAL position as shown in the drawings, the output of amplifier U3 is disconnected from the feedback path back to the probe 12 through transistor Q4. However, capacitor C11 will store the voltage that was applied to the gate of transistor Q4, which voltage was required to zero the circuit. In effect, capacitor C11 acts as a memory capacitor which continually biases the probe shield to the level determined by the foregoing zeroing process.

It should also be noted that even with S2 in its NORMAL position, capacitor C14 will also store its previously charged potential level. Consequently, when switch S2 is in its NORMAL position and switch S3 is in its HOLD position, the stored charge on capacitor C14 will bias transistor Q2 in such manner as to maintain the duty cycle of transformer T1 to zero. Consequently, no feedback from the multiplier circuit 120 is permitted till the probe 12 is ready for use.

To use the probe 12, to measure charge levels on a test surface the probe 12 is merely pulled apart to align the windows 54, 56 and expose the rod to the charged surface to be measured. The function switch S3 is then switched to its READ position as shown in the drawings. This connects the gate of transistor Q2 to the output of amplifier U3. Accordingly, the duty cycle of transformer T1 is now under the control of the error signal from operational amplifier U3. When the sensor rod of probe 12 is influenced by an external field, the gate and therefore the source of transistor Q3 proportionally increase in voltage. Consequently, the absolute magnitude of the output signal from amplifier U3 increases accordingly. In this embodiment, this output signal is inverted and drives the gate of transistor Q2 downward thereby increasing the duty cycle to T1. Therefore, the voltage developed at the secondary transformer T1 increases as a function of the difference between the charge on the probe rod and that of the reference voltage. As previously described, this voltage is multiplied by voltage multiplier 120 and fed back to the negative side of battery 102 via line 122.

The output of multiplier 120 is also fed back to the probe shield via line 124. The potential on line 124 is impressed on capacitor C11 which drives transistor Q4. The source voltage of transistor Q4 follows that of the gate. Hence, the probe shield is biased at the potential of multiplier 120 via cable 36. In such manner the probe shield is brought up to the same voltage as the surface being measured. Since the probe sensor rod is now present in a null field (the test surface and shield being at the same potential), it is substantially spacing insensitive, i.e., the amount of charge capacitively coupled to the sensor rod is not critically dependent upon the distance between it and the test surface.

This feedback activity continues all during the time that probe 12 is taking a reading with switch S3 in its READ position. The feedback voltage from multiplier 120 will vary somewhat during this process in an attempt to bring the probe shield and rod voltage levels into equilibrium. In order to freeze this feedback voltage at a particular time to take a measurement by the voltmeter 14, switch S3 is then positioned into its HOLD position (with its wipers contacting poles E and G), with switch S2 remaining in its NORMAL position as shown. Consequently, the output of amplifier U3 is disconnected from the gate of duty cycle transistor Q2. Instead, it is fed back to its non-inverting input through switch S2. This converts amplifier U3 into a voltage follower and prevents spurious oscillations which can effect the gate voltage of Q2. Even though the amplifier U3 is disconnected from Q2, hold capacitor 14 remains charged to the same voltage level just prior to the amplifier U3 being disabled by the repositioning of switch S3. Consequently, the duty cycle will remain constant over a relatively long period of time, long enough to conveniently measure the now constant voltage emanating from the voltage multiplier 120. It will be remembered that this voltage, although being fed back to the probe shield, is equivalent to that being sensed by the probe rod. Therefore, a reading by meter 14 can be taken from the multiplier 120 output as shown in FIG. 6. When another reading is desired to be made, switch S3 is then returned to its READ position. Similarly, this reading can be measured by then switching S3 back to its HOLD position.

It is another feature of this invention that the operation of the electrometer can be automatically tested prior to use. The condition of battery 102 will determine the maximum voltage output of multiplier 120. Since the measurement by voltmeter 14 is made at the output of multiplier 120, it is necessary to know the maximum voltage level that can be read by the electrometer. For example, if the battery 102 is charged to a potential level of less than 9 volts, the output voltage from multiplier 120 may only be 1000 volts. Accordingly, if the electrometer probe is reading a test surface whose potential level is higher than 1000 volts, an inaccurate reading could be made since the electrometer will only read out a maximum 1000 volts with the battery 102 in this condition. To insure that this phenomena does not occur, the operator merely throws switch S2 into its ZERO/TEST position while leaving switch S3 in its READ position. With the switches in these positions, the battery 102 is fed back to the inverting input of amplifier U3 through resistor R13. This signal overcomes that from the sensing transistor Q3. This causes the output of amplifier U3 to provide a negative voltage on the gate of transistor Q2. This feeds a low voltage to the non-inverting input of amplifier U2 thereby increasing the duty cycle to transformer T1 to its maximum. With this 100% duty cycle, the voltage multiplier 120 consequently outputs its maximum voltage. This voltage can be read by meter 14, which voltage signifies the maximum voltage that the electrometer is capable of reading under the battery conditions which exist. This also insures that the various components in the circuit are operating properly. A malfunction of the components would be indicated by an abnormal voltmeter reading.

Since the user will normally zero and test the electrometer prior to taking a reading, the switch S2 should be in the ZERO/TEST position when first turning the device on via switch S1. If switch S2 has inadvertantly been left in its NORMAL position, the voltage multiplier 120 may provide an unwanted charge on the probe 12 by initial transients. In order to prevent this inadvertent occurrence, a programmable unijunction transistor 113 is utilized. If the switch S2 has been left in its NORMAL position when the device is initially turned on, the transistor 113 is saturated thereby pulling down the voltage on its gate. This signal is coupled to the reset input A1 of multivibrator 104 and, hence, it is disabled. When the switch S2 is placed in its ZERO/TEST position, the gate of transistor 113 is raised to such a level that the multivibrator 104 is enabled for future operation. Accordingly, initial transients are isolated from the probe 12 when the device is first turned on.

Therefore, it should be understood that while this invention has been described in connection with particular embodiments thereof, no limitation is intended thereby except as defined in the following claims.

What is claimed is:

1. In an electrometer for measuring electrostatic potential levels, with the electrometer including a probe for receiving charge from a test surface, said probe having a charge receiving sensor element and a surrounding shield, wherein the improvement comprises:
    means for producing electrical pulses of a given pulse width;
    a transformer;
    means for coupling said pulses to the transformer;
    means for applying the output of the transformer to the probe shield thereby rendering said probe substantially spacing insensitive; and
    means for regulating the width of the pulses to the transformer in accordance with the amount of charge sensed by the probe sensor element.

2. The improvement of claim 1 wherein said pulse producing means comprises:
    an astable multivibrator; and
    a differentiator coupled to the output of the multivibrator, with the differentiator shaping the multivibrator output signal into triangular shaped pulses.

3. The improvement of claim 2 wherein said regulator means comprises:
    regulating transistor means for providing a d.c. level output indicative of the amount of charge sensed by the probe sensor element; and
    a comparator means for comparing the triangular pulses from the differentiator and the d.c. level output from the transistor means, said comparator providing output pulses to said transformer of a width depending upon the difference between the differentiator and transistor means input signals.

4. The improvement of claim 3 which further comprises:

means for internally generating a reference voltage;

sensing transistor means coupled to the probe sensor element for providing a voltage output indicative of the charge on the element;

integrator means for integrating the difference between the reference voltage and the sensing transistor output voltage; and means for coupling the integrator output signal to the input of said regulating transistor means, said integrator signal causing said regulating transistor to output a d.c. level in accordance with the integrator output signal thereby increasing the pulse width to the transformer as the charge on the probe element increases above the reference potential.

5. The improvement of claim 2 which further comprises:

means for selectively disabling the operation of the multivibrator during device initialization thereby inhibiting unwanted transients on the probe.

6. In a d.c. feedback electrometer having a probe with a charge receiving sensor element and surrounding shield, as well as circuitry for feeding back to the probe shield a potential level equivalent to that sensed by the probe element, the improvement comprising:

a battery for driving said feedback voltage circuitry;

means for regulating the amount of voltage generated by the feedback circuitry; and testing means for enabling said regulation means to cause said voltage feedback circuitry to produce its maximum voltage thereby permitting a measurement of the maximum readable voltage by the electrometer for the battery condition that exists.

7. The improvement of claim 6 wherein switching means are provided to selectively enable said testing means.

* * * * *